United States Patent [19]

Blankenship et al.

[11] Patent Number: 4,734,886
[45] Date of Patent: Mar. 29, 1988

[54] AUXILIARY WORD LINE DRIVER FOR EFFECTIVELY CONTROLLING PROGRAMMABILITY OF FUSIBLE LINKS

[75] Inventors: Timothy L. Blankenship, Palm Bay, Fla.; Joseph G. Nolan, III, San Jose, Calif.

[73] Assignee: Harris Corporation, Melbourne, Fla.

[21] Appl. No.: 790,115

[22] Filed: Oct. 22, 1985

[51] Int. Cl.⁴ ........................ G11C 17/00; G11C 17/06
[52] U.S. Cl. ........................................ 365/94; 365/96; 365/104; 365/105
[58] Field of Search ................... 365/94, 96, 104, 105, 365/230

[56] References Cited

U.S. PATENT DOCUMENTS

| | | | |
|---|---|---|---|
| 4,101,974 | 7/1978 | Immer et al. | 365/96 |
| 4,130,889 | 12/1978 | Chua | 365/189 X |
| 4,287,569 | 9/1981 | Fukushima | 365/96 |

Primary Examiner—Stuart N. Hecker
Assistant Examiner—Alyssa H. Bowler
Attorney, Agent, or Firm—Antonelli, Terry & Wands

[57] ABSTRACT

The problem of the distributed voltage drop along a resistive word line through which fusible elements of a circuit array are selectively programmed to a state of high resistance (effective open circuit) is circumvented by incorporated an auxiliary word line driver as part of the array. The auxiliary word line driver is coupled to the word line at a location apart from the main word line driver, so as to reduce the effective resistance and consequential voltage drop along the word line. As a result, for each memory cell along a respective word line there is sufficient "rupturing current" capability, whereby each fusible element of the memory array may be successfully programmed regardless of its physical location within the array.

3 Claims, 2 Drawing Figures

AUXILIARY WORD LINE DRIVER FOR EFFECTIVELY CONTROLLING PROGRAMMABILITY OF FUSIBLE LINKS

FIELD OF THE INVENTION

The present invention relates to programmable circuit elements and is particularly directed to a circuit arrangement for effectively controlling the programmability of fusible links the severing current for which is supplied through resistive lines.

BACKGROUND OF THE INVENTION

Fusible links (e.g. nichrome, doped polysilicon strips) are commonly employed in memories, logic circuit arrays, amplifier circuits, etc. to define at least one prescribed circuit or subsystem state or functionality. In memory logic devices an individual logic element (e.g. a one-bit memory cell) is typically comprised of an input/output switch (an MOS or bipolar transistor or diode) and a fusible (resistive) element coupled together between an address line and an output (bit) line for that cell. The fusible element itself is normally of very low resistance which is converted to a high resistance (open circuit) state by applying a predetermined amount of energy (power × time) to the element, so as to sever or "blow" the fuse. The amount of power delivered to the fusible element depends upon several factors including voltage level, the characteristics of a programming switch (transistor) through which the fusible element of a particular fusible element is selected, the characteristics of the memory cell transistor and the resistance of the line through which the memory cell of interest is addressed.

A portion of an exemplary array (M rows × N columns) of memory cells, in which fusible elements are employed, is diagrammatically illustrated in FIG. 1 as comprising a (row) address input 11 coupled to a row driver 12, the output of which is supplied to a word line 13 for driving all the memory cells of that particular row. In FIG. 1, only two memory cells 16-1 and 16-N of the row of interest are shown, in order to simplify the drawing. Of these two cells, memory cell 16-1 is physically located closest to row driver 12, while memory cell 16-N is physically located farthest away from row driver 12. Each memory cell contains a transistor switch and a fusible element for selectively controlling the state of an associated bit (column) line.

For this purpose, memory cell 16-1 contains a bipolar transistor 23, the collector 23C of which is coupled to collector voltage supply terminal (+V), the base 23B of which is coupled to row line 13 and the emitter 23E of which is coupled via fusible link 24 to an associated bit line 21-1. Similarly, memory cell 16-N contains a bipolar transistor 25, the collector of which is coupled to collector voltage supply terminal (+V), the base 25B of which is coupled to row line 13 and the emitter 25E of which is coupled via fusible link 26 to an associated bit line 16-N.

For selectively programming the memory cells of the array a respective programming switch is coupled to each bit line 21-1 . . . 21N. Thus bit line 21-1 has a programming MOSFET switch 31-1 the drain of which is coupled to line 21-1 and the source of which is coupled to a reference potential terminal (e.g. ground). The gate of each programming MOSFET is coupled to a respective bit line enable input. To selectively sever or "blow" the fuse of a particular memory cell, respective address-/enable signals are applied to the associated row driver 12 and programming switch 31-i for that memory cell, thereby turning-on the bipolar transistor of the memory cell and the MOSFET switch of the programming switch, to provide a "fuse-rupturing" current flow path from +V to ground through the fusible link of the addressed cell.

In memory arrays where the word line 13 is made of metal (e.g. gold or aluminum) there is no appreciable voltage drop from memory cell 16-1 to cell 16-N along line 13, so that each cell may be programmed with the same expectancy of success. However, in memory arrays wherein the resistance of the word line 13 is not insignificant, as in the case of an interconnect configuration using polysilicon as the word line material, the resistance of the line, denoted by distributed resistors 14 in FIG. 1, introduces a significant voltage drop along the line from the memory cell 16-1 closest to driver 12 to the memory cell 16-N farthest away from driver 12. For long word lines, as are found in high density memories, for example, this voltage drop reduces the effective base drive voltage to the bipolar transistors of the respective memory cells, thereby reducing the current flow to the fusible elements, which can affect programming yield and reliability over the life of the array by not sufficiently "blowing" the fusible element to produce the desired high resistance.

SUMMARY OF THE INVENTION

In accordance with the present invention, the problem of the distributed voltage drop along a resistive word line through which fusible elements of a circuit array are selectively programmed or "blown" to a state of high resistance (effective open circuit) is circumvented by incorporating an auxiliary word line driver as part of the array. The auxiliary word line driver is coupled to the word line at a location apart from the main word line driver so as to reduce the effective resistance and consequential voltage drop along the word line. As a result, for each memory cell along a respective word line there is sufficient "rupturing current" capability whereby each fusible link of the memory array may be successfully programmed regardless of its physical location within the array.

Pursuant to a preferred embodiment of the invention, the auxiliary word line driver of each word (row) line comprises a NAND gate the output of which is coupled to enable an auxiliary power switching transistor which is coupled between an auxiliary voltage supply and the word line. A first input of the NAND gate is also coupled to the word line and a second input is coupled to receive an enabling voltage during programming of the fusible links of the row. The combination of the word line address signal voltage from the principal word line driver (at the first input of the NAND gate) and a program enable voltage (at the second input of the NAND gate) causes the output of the NAND gate to switch states, thereby turning on the auxiliary power switching transistor and coupling the auxiliary voltage to the word line. Preferably the auxiliary word line driver is coupled to that position of the word line farthest from the principal word line driver, thereby reducing the effective resistance of the word line by seventy-five percent, which translates into a higher programming yield for each fusible element as contrasted to the single word line driver configuration of FIG. 1, described above.

DETAILED DESCRIPTION

Figure 1:
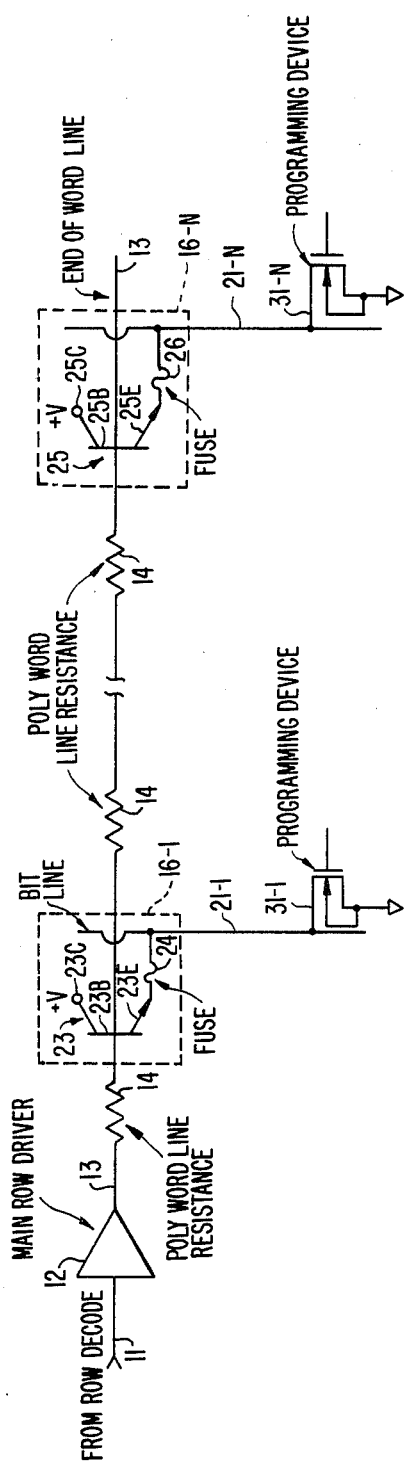
FIG. 1 is a schematic illustration of a portion of a memory array employing a single word line driver per row.
Figure 2:
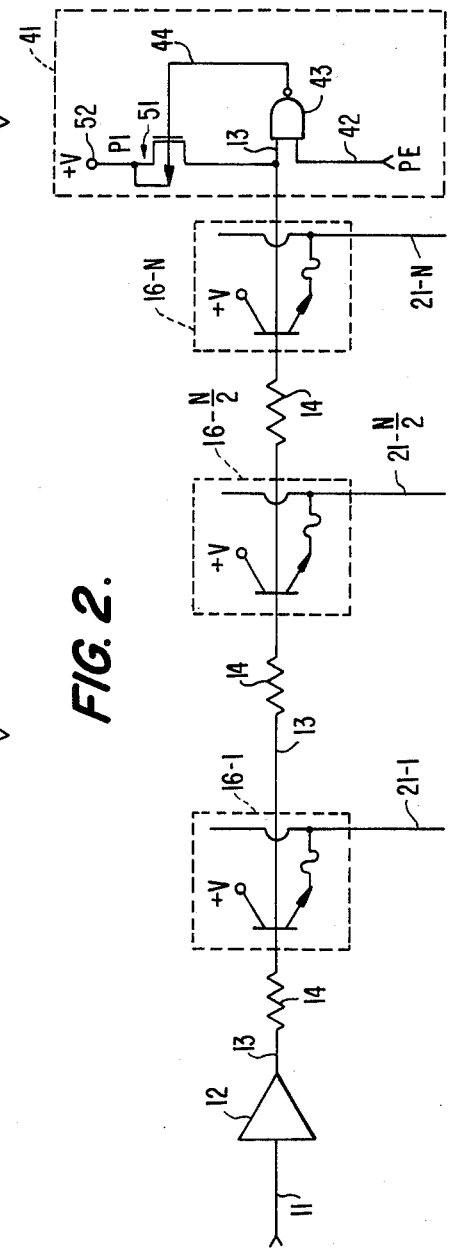
FIG. 2 is a schematic illustration of a portion of a memory array employing multiple word line drivers per row.

Referring now to FIG. 2 which shows the application of the present invention to the environment of a memory array as shown in FIG. 1, described above, the improved programmable fusible link driver circuit of the present invention comprises an auxiliary word line driver 41 which is coupled to the far, or remote, end of resistive word line 13 relative to principal word line driver 12. Auxiliary driver 41 includes a NAND gate 43, a first input 42 of which is coupled to receive a program enable voltage (PE) which is applied only during programming (selective rupturing of a fusible element) of a respective memory cell of the row of interest. A second input of NAND gate 43 is coupled to word line 13. The output 44 of NAND gate 41 is coupled to the gate of P-channel MOSFET switching transistor 51, the drain of which is coupled to word line 13 and the source of which is coupled to an auxiliary voltage terminal 52.

In operation, during programming of any memory cell along row line 13, a program enabling voltage level PE (logic level "one") is applied to the input 42 of NAND gate 43. With the addressing of word line 13 via row driver 12, a logical "one" is applied to the second input of NAND gate 43. Since a logical "one" is applied to each of the inputs of NAND gate 43, output 44 goes low, turning on MOSFET 51, and coupling auxiliary voltage +V at terminal 52 through MOSFET 51 to the "far end" of word line 53. As a result, each end of word line 13 sees the same voltage (V+), so that the cumulative voltage drop along the distributed resistance between the opposite ends of the polysilicon word line 13 is now lowest at the middle of the word line 13 rather than the far end of line 13. In FIG. 2 the middle of the link is denoted by the location of memory cell 16-N/2. The resistance seen by memory cell 16-N/2 is the effect of the resistance of line 13 from driver 12 to cell 16-N/2 and the resistance of line 13 from auxiliary driver 41 to cell 16-N/2. For substantially the same word line distance between cell 16-N/2 and drivers 12 and 42, the effective resistance is that of parallel connected resistances each having one-half the resistance of the entire word line or one-fourth the resistance of the word line 13. Namely, the effective resistance is decreased by seventy-five percent, thereby ensuring sufficient base drive for each bipolar transistor through which current for "blowing" the associated fusible element is supplied.

As will be appreciated from the foregoing description, the incorporation of an auxiliary word line driver as part of the programming mechanism for a circuit employing a resistive line (e.g. polysilicon) reduces the programmability impairing voltage drops along the line and enchances the probability of success (yield) of accurately and completely programming the circuit. For semiconductor memory arrays that contain only one level of metal of interconnect, thereby necessitating use of polysilicon as interconnect material, which inherently introduce distributed resistance between memory cells, the use of an auxiliary word line driver avoids the need for additional processing steps for reconfiguring the materials of the array architecture, i.e. adding additional metal, replacing polysilicon.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. For use in a circuit having a plurality of storage elements, selected characteristics of which are programmable by the application thereto of a control stimulus coupled to said elements through a prescribed medium, an arrangement for enhancing the capability of said prescribed medium to supply said control stimulus to said storage elements comprising a plurality of control stimulus supplying devices coupled to said medium, and wherein said respective ones of said control stimulus supplying devices are coupled to spaced apart locations of said prescribed medium, and wherein said prescribed medium is an electrically resistive medium and each of said storage elements includes a fusible element to which an electrical characteristic-altering current is coupled in response to the application of a control stimulus to said each storage element, and wherein a storage element includes controlled switching element, coupled between a source of electrical characteristic-altering current and said fusible element, and responsive to the application of a control stimulus thereto from said resistive medium for coupling said source of electrical characteristic-altering current to said fusible element, and wherein said resistive medium comprises an interconnect layer of semiconductor material overlying a substrate containing said plurality of storage elements and wherein respective ones of said control stimulus supplying devices are coupled to spaced apart locations of said interconnect layer, and wherein said circuit comprises a memory array of said storage elements, and wherein said interconnect layer comprises a respective word line through which selected ones of said storage elements are addressed, and wherein said control stimulus supplying devices include a first word line driver coupled to a first location of said interconnect layer and an auxiliary word line driver coupled to a second location of said interconnect layer spaced apart from said first location thereof, and wherein said first and auxiliary word line drivers are coupled to opposite ends of said interconnect layer, and wherein said auxiliary word line driver comprises a logic gate one input of which is coupled to said interconnect layer and an output of which is coupled to control the selective coupling of a prescribed voltage level to said interconnect layer, and wherein said logic gate comprises a NAND gate a first input of which is coupled to said interconnect layer, an output of which is coupled to a switching circuit for selectively coupling said voltage level to said interconnect layer, a second input of said NAND gate being coupled to receive a prescribed programming input, and wherein a storage element further includes a transistor, a first, input electrode of which is coupled to a prescribed voltage supply terminal, a second, control electrode of which is coupled to said interconnect layer, and a third, output electrode of which is coupled to one end of said fusible element, and wherein a second end of said fusible element is coupled to a respective bit line of said memory array.

2. For use in a programmable logic circuit having a plurality of storage elements, each of which contains a fusible element for defining the state of information stored by said storage element by the selective application thereto of electrical energy sufficient to substantially alter the state of said fusible element from a low resistance state to a high resistance state, each of said plurality of storage elements being coupled to a programming link for receiving therefrom a programming control input in response to which electrical energy is applied to said fusible element, an arrangement for enhancing the ability of said programming link to deliver said programming control input to each of said storage elements and thereby said sufficient electrical energy to be applied to said fusible element, said arrangement comprising a plurality of driver circuits coupled to said programming link for coupling to spaced apart locations thereof voltage levels sufficient to effectively compensate for voltage drops along said programming link created by the resistance of the programming link and to enable a programming control input that is coupled over said link to any storage element to be of a level to cause said sufficient electrical energy to be coupled to the fusible element of said any storage element, and wherein said programming link comprises an interconnect layer of semiconductor material overlying a substrate containing said plurality of storage elements, and wherein one of said driver circuits is coupled to one end of said interconnect layer for supplying said programming control input to said interconnect layer and a second of said driver circuits is coupled to an opposite end of said interconnect layer for coupling thereto a prescribed compensation voltage, and wherein said second driver circuit comprises a logic gate one input of which is coupled to said interconnect layer and an output of which is coupled to control the selective coupling of a prescribed voltage level to said interconnect layer, and wherein said logic gate comprises a NAND gate a first input of which is coupled to said interconnect layer, an output of which is coupled to a switching circuit for selectively coupling said voltage level to said interconnect layer, a second input of said NAND gate being coupled to receive a prescribed programming input.

3. For use in a programmable logic circuit having a plurality of storage elements, each of which contains a fusible element for defining the state of information stored by said storage element by the selective application thereto of electrical energy sufficient to substantially alter the state of said fusible element from a low resistance state to a high resistance state, each of said plurality of storage elements being coupled to a programming line for receiving therefrom a programming control input in response to which electrical energy is applied to said fusible element, a method of enhancing the ability of said programming link to deliver said programming control input to each of said storage elements and thereby enable said sufficient electrical energy to be applied to said fusible element comprising the step of coupling to said programming link, at spaced apart locations thereof, voltage levels sufficient to effectively compensate for voltage drops along said programming link created by the resistance of the programming link and to enable a programming control input that is coupled over said link to any storage element to be of a level to cause said sufficient electrical energy to be coupled to the fusible element of said any storage, and wherein said programming link comprises an interconnect layer of semiconductor material overlying a substrate containing said plurality of storage elements, and wherein said step comprises coupling a first driver circuit to one end of said interconnect layer for supplying said programming control input to said interconnect layer and a second driver circuit to an opposite end of said interconnect layer for coupling thereto a prescribed compensation voltage, wherein said second driver circuit comprises a logic gate one input of which is coupled to said interconnect layer and an output of which is coupled to control the selective coupling of a prescribed voltage level to said interconnect layer, and wherein said logic gate comprises a NAND gate a first input of which is coupled to said interconnect layer, an output of which is coupled to a switching circuit for selectivley coupling said voltage level to said interconnect layer, a second input of said NAND gate being coupled to receive a prescribed programming input.

* * * * *